US008653420B2

(12) United States Patent
Arai

(10) Patent No.: US 8,653,420 B2
(45) Date of Patent: Feb. 18, 2014

(54) TEMPERATURE CONTROL CIRCUIT OF OVEN CONTROLLED CRYSTAL OSCILLATOR

(75) Inventor: Junichi Arai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 86 days.

(21) Appl. No.: 13/474,707

(22) Filed: May 17, 2012

(65) Prior Publication Data

US 2012/0292300 A1 Nov. 22, 2012

(30) Foreign Application Priority Data

May 18, 2011 (JP) ................................ 2011-111439
Mar. 5, 2012 (JP) ................................ 2012-047609

(51) Int. Cl.
*H05B 3/00* (2006.01)
*H01L 35/00* (2006.01)

(52) U.S. Cl.
USPC ........... 219/210; 219/494; 219/499; 219/501; 219/505; 327/513; 327/518; 374/E7.016; 374/E7.018

(58) Field of Classification Search
USPC .......... 219/210, 494, 499, 501, 505; 327/513, 327/518; 374/E7.016, E7.018
See application file for complete search history.

(56) References Cited

FOREIGN PATENT DOCUMENTS

| | | |
|---|---|---|
| JP | 1995-240628 | 9/1995 |
| JP | 2000-183649 | 6/2000 |
| JP | 2011-004382 | 1/2011 |

*Primary Examiner* — Shawntina Fuqua
(74) *Attorney, Agent, or Firm* — Jianq Chyun IP Office

(57) ABSTRACT

A temperature control circuit of an oven controlled crystal oscillator (OCXO) is provided. A first and a second digital potentiometer are correspondingly arranged in a bridge circuit which outputs a voltage to an input terminal of a differential amplifier (OPAMP), wherein the resistance value of the first digital potentiometer is adjustable so as to adjust the temperature of the oven to the peak temperature of the crystal resonator, and the resistance value of the second digital potentiometer is adjustable so as to cancel the temperature gradient of the first digital potentiometer. In the temperature control circuit of OCXO, the heat generation of the heater resistor is controlled by the power transistor based on the control voltage from the differential amplifier.

20 Claims, 4 Drawing Sheets

TEMPERATURE CONTROL CIRCUIT OF OVEN CONTROLLED CRYSTAL OSCILLATOR

CROSS-REFERENCE TO RELATED APPLICATION

This application claims the priority benefit of Japan patent application serial no. 2011-111439, filed on May 18, 2011, and 2012-047609, filed on Mar. 5, 2012. The entirety of each of the above-mentioned patent applications is hereby incorporated by reference herein and made a part of specification.

BACKGROUND OF THE INVENTION

1. Field of the Application

The present invention relates to an oven controlled crystal oscillator (OCXO) capable of obtaining oscillation frequency with a high stability, and more particularly, to a temperature control circuit of an oven controlled crystal oscillator capable of adjusting a temperature of the oven to a peak temperature of the crystal and canceling the temperature gradient.

2. Description of Related Art

[Prior Art]

The operation temperature of the crystal resonator of an oven controlled crystal oscillator is maintained at a constant temperature, thus the frequency, which depends on the frequency-temperature characteristic, maintains unchanged. An oscillation frequency with a high stability is thereby obtained in an OCXO. A crystal resonator is accommodated in a thermostatic oven, and the temperature of the thermostatic oven is controlled at a constant temperature by using a temperature control circuit.

[Temperature Control Circuit of a Conventional Oven Controlled Crystal Oscillator: FIG. 4]

FIG. 4 schematically illustrates a temperature control circuit diagram of a conventional oven controlled crystal oscillator of related art. A temperature control circuit of a conventional oven controlled crystal oscillator is described with reference to FIG. 4. FIG. 4 schematically illustrates a circuit diagram of a temperature control circuit of a conventional oven controlled crystal oscillator. Basically, as shown FIG. 4, the temperature control circuit of a conventional OCXO includes a thermistor TH1, a differential amplifier (OPAMP) IC, a power transistor Q and a heater resistor H1.

[Connection Relationship]

A supply voltage VCC is applied to an end of the heater resistor H1, and the other end of the heater resistor H1 is connected to a collector of the power transistor Q, and an emitter of the power transistor Q is connected to the ground GND.

In addition, supply voltage VCC is also applied to an end of the thermistor TH1, and the other end of the thermistor TH1 is connected to an end of the resistor R1, and the other end of the resistor R1 is connected to an end of the resistor RR, and the other end of the resistor RR is connected to the ground GND.

Moreover, the supply voltage VCC is also applied to an end of the resistor R2, and the other end of the resistor R2 is connected to an end of the resistor R3, and the other end of the resistor R3 is connected to the ground GND. In addition, the supply voltage VCC is applied to the differential amplifier IC and the differential amplifier IC is connected to the ground GND.

Then, a point between the other end of the thermistor TH1 and an end of the resistor R1 is connected to a first input terminal (negative terminal) of the differential amplifier IC via a resistor R4, and a point between the other end of the resistor R2 and an end of the resistor R3 is connected to a second input terminal (positive terminal) of the differential amplifier IC. In addition, the first input terminal of the differential amplifier IC is connected to an output terminal of the differential amplifier IC via a resistor R5. Then, the output terminal of the differential amplifier IC is connected to a base of the power transistor Q via a resistor R6.

[Each Part]

The thermistor TH1 is a temperature sensor whose resistance value varies with temperature and detects the operational temperature of the crystal resonator. In the differential amplifier IC, the voltage between the thermistor TH1 and the resistor R1 is input to the first input terminal (negative terminal) via the resistor R4 with the output terminal of the differential amplifier IC inputting a feedback via the resistor R5, and the voltage between the resistor R2 and the resistor R3 is input to the second input terminal (positive terminal), and the voltage difference between the two input terminals (negative terminal and positive terminal) is amplified.

In the power transistor Q, the output of the differential amplifier IC is input to the base via the resistor R6, and a current flows between the collector and the emitter corresponding to the applied voltage of the base so that a current also flows through the heater resistor H1. The heater resistor H1 generates a heat corresponding to the current flowed. Herein the power transistor Q and the heater resistor H1 become heat sources.

The above mentioned configuration is to maintain the temperature to be constant within the oven. Nevertheless, in order to change the temperature within the oven, the resistance value of the resistor RR is correspondingly changed.

[Frequency-Temperature Characteristic]

The frequency-temperature characteristic of the crystal resonator is a cubic curve. The oven controlled crystal oscillators realize the high stability by adjusting the temperature of the thermostatic oven at a most stable peak temperature (generally 80 to 95° C.). Since the peak temperature is within about 15° C. range, an adjustment of the temperature of the oven by using the resistor RR is required.

Since oven controlled crystal oscillators are to be used in measuring instruments or base stations with high accuracy, or the like for a long time such as 10 years or 20 years, fixed resistors RR are assembled one by one in OCXO. If analog mechanical variable resistors are used in OCXO, the resistance value may vary due to vibration, heat and deterioration of contact surface caused by oxidation. Accordingly, the preset temperature of the thermostatic oven and the frequency may vary, which has become a major problem; thus, the analog mechanical variable resistors are not generally used.

Furthermore, it is easy to determine the peak temperature of the crystal resonator unit during manufacturing. However, once the crystal resonator unit is assembled in an actual oscillation circuit, the peak temperature may generally shift due to the variation of the assembly between the oscillation circuit and the thermostatic oven. The peak temperature cannot be adjusted easily, it requires one-by-one measuring from outside by using a switch and a resistance value change.

[Related Art]

Additionally, Japanese Patent Laid-Open no. 2011-004382 "Temperature-Controlled Crystal Oscillator" (NDK Co., Ltd.) [Patent document 1], Japanese Patent Laid-Open no. 1995-240628 "Control Circuit of Thermostatic Oven and Crystal Oscillator Using the Same" (NDK Co., Ltd.) [Patent document 2], and Japanese Patent Laid-Open no. 2000-

183649 "High Stable Piezoelectric Oscillator" (Toyo Communication Equipment Co., Ltd.) [Patent document 3] are the related arts.

In the Patent document 1, the reference voltage input to the input terminal (positive terminal) of the operational amplifier (differential amplifier) 14 is divided into the voltage of linear resistor 12 and the voltage of resistor 13B, wherein the resistance value of the linear resistor 12 is varied corresponding the ambient temperature.

In the Patent document 2, in the control circuit of the thermostatic oven, the voltage input to the input terminal (negative terminal) of the differential amplifier circuit 7 is divided into the voltage of thermistor 10 and the voltage of digital potentiometer 18, wherein the resistance value of the digital potentiometer 18 is set with respect to an external signal.

In the Patent document 3, in the temperature control unit of the high stable crystal oscillator, the voltage input to the gate of the transistor Tr2, which operates the heaters H1 and H2, is divided into the voltage of thermistor Th, the voltage of the transistor Tr3 and digital variable resistor ICRv1, wherein the resistance value of the digital variable resistor ICRv1 can be set externally.

Patent document 1: Japanese Patent Laid-Open no. 2011-004382

Patent document 2: Japanese Patent Laid-Open no. 1995-240628

Patent document 1: Japanese Patent Laid-Open no. 2000-183649

However, in conventional oven controlled crystal oscillators, regarding the shifting of the peak temperature of the crystal resonator after the circuit is assembled, an external adjustment of the resistance value is required, in which the preparation and the measurement are time-consuming during the manufacturing process.

Besides, when a chip resistor is used to adjust a temperature range of 15° C., the resistor is actually assembled in 24 lines or 96 lines and is preferred to have a resistance value matching the peak temperature of the original crystal resonator. However, it is not necessarily to choose the resistance for the peak temperature.

Moreover, when the resistance for adjusting the oven temperature to the peak temperature is replaced by a potentiometer, the potentiometer has a temperature gradient of +100 to 800 ppm/° C.; accordingly, high stability cannot be achieved.

In addition, though the conventional temperature control circuit (shown in FIG. 4) operates to attempt to maintain the temperature inside the oven to be constant, there is still a small temperature variation. Therefore, in order to mitigate the variation, the resistor RR may be replaced by a diode. Diodes have a temperature dependence on the forward voltage and thus the variation can be compensated.

However, the forward voltage of the diode is 0.7 V, and the adjustment voltage is fixed to 0.7 V by using one diode, and is fixed to 1.4 V by using two diodes. The adjustment voltage by using the diode(s) is not appropriate for an adjustment voltage of a low voltage type control circuit, 3.3 V or 2.5 V, which is the mainstream in recent years. Thus, it is difficult to use diode(s) to compensate the temperature variation.

In order to resolve the above-mentioned problem, the Patent document 1 discloses a compensation method which can be used in low voltage. However, as the aforementioned, since the oven controlled crystal oscillators have high stability such as a frequency deviation of $10^{-9}$ ppb, furthermore with complicated thermostatic oven structures, each of the structures has a specific temperature characteristic. Thus, even if the calibration method of the Patent document 1 is used, mechanical and individual adjustment is still required, and is time-consuming.

In addition, the modification method of the Patent document 1 can only modify the variation in one direction. The direction that should be modified relates to a plurality of elements; Thus, it cannot be determined by theoretical design but can be determined by trial-and-error, and this trial-and-error method required for adjustment is rather time-consuming.

Additionally, in the Patent document 2, the voltage input into the input terminal of the differential amplifier is divided into voltage of thermistor and voltage of digital potentiometer, and the resistance value of the digital potentiometer can be changed externally. Further, the oscillation frequency can be easily set. However, the temperature gradient of the potentiometer cannot be cancelled.

Furthermore, in the Patent document 3, the voltage input to the gate of the transistor which operates the heaters is divided into voltage of thermistor, voltage of transistor and digital variable resistor, and the temperature of the thermostatic oven can be reduced, and deterioration of the electronic device can also be reduced. However, the temperature gradient of the digital variable resistor cannot be cancelled.

Moreover, in the Patent document 1, for inputting the reference voltage input to the input terminal of the operational amplifier, a linear resistor of which the resistance value varies according to the ambient temperature is disposed, and for the temperature variation, stabilizing the reference voltage is shown in the figures. However, being able to cancel the temperature gradient of the potentiometer is not disclosed.

SUMMARY OF THE INVENTION

Accordingly, the present invention provides a temperature control circuit of oven controlled crystal oscillator. The temperature control circuit is capable of adjusting a temperature of the oven to the peak temperature of the crystal resonator of OCXO as well as canceling the temperature gradient of the potentiometer of OCXO.

In order to resolve the aforementioned problems, the present invention provides a temperature control circuit of OCXO. The temperature control circuit includes a heater resistor, a thermistor, a first resistor, a first digital potentiometer, a second digital potentiometer, a second resistor, a differential amplifier and a power transistor. The heater resistor has an end connected to a supply voltage and generates heat. The thermistor has an end connected to and supplied by the supply voltage. A resistance value of the thermistor varies with a temperature of the thermistor, and the other end of the thermistor outputs a voltage corresponding to the temperature. The first resistor has an end connected to the other end of the thermistor. The first digital potentiometer has an end connected to the other end of the first resistor and has the other end connected to a ground. A resistance value of the first digital potentiometer is adjustable in a digital controlled manner. The second digital potentiometer has an end connected to and supplied by the supply voltage. A resistance value of the second digital potentiometer is adjustable in a digital controlled manner. The second resistor has an end connected to the other end of the second digital potentiometer and has the other end connected to the ground. The differential amplifier has a first input terminal, a second input terminal and an output terminal, wherein a voltage between the other end of the thermistor and an end of the first resistor is input to the first input terminal. A voltage between the other end of the second digital potentiometer and an end of the second resistor is input to the second input terminal. The output terminal is connected to the first input terminal via a third resistor to provide a feedback. The difference between the voltage input to the first input terminal and the voltage input to the second input terminal is amplified and output as a control voltage from the output terminal of the differential amplifier. The power transistor includes a collector, an emitter and a base. The collector is connected to the other end of the heater resistor. The base inputs the control voltage output from the differential amplifier. The emitter is connected to the ground, wherein the power transistor controls the heat generated by the heater resistor based on the control voltage of the differential amplifier. The temperature of the oven can be adjusted to the peak temperature of the crystal resonator of OCXO and the temperature gradient of the digital potentiometer can be cancelled.

According to an exemplary embodiment of the present invention, the resistance value of the first digital potentiometer is adjustable so as to adjust the temperature of the oven to the peak temperature of a crystal resonator of the oven controlled crystal oscillator, the resistance value of the second digital potentiometer is adjustable so as to cancel a temperature gradient of the first digital potentiometer.

According to an exemplary embodiment of the present invention, the resistance value of the second digital potentiometer is greater than the resistance value of the first digital potentiometer.

According to an exemplary embodiment of the present invention, a fourth resistor is arranged between the supply voltage and an end of the second digital potentiometer in series.

According to an exemplary embodiment of the present invention, a fifth resistor is arranged in parallel with the second digital potentiometer.

According to an exemplary embodiment of the present invention, the voltage between the other end of the thermistor and an end of the first resistor is input to the first input terminal via a sixth resistor, and the control voltage output from the output terminal of the differential amplifier is input to the base of the power transistor via a seventh resistor.

The present invention further provides an oven controlled crystal oscillator having the above mentioned temperature control circuit.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF REFERENCE NUMERALS

H1: heater resistor
IC: differential amplifier
R1, R2, R3, R4, R5, R6, R7, R8, RR: resistor
Rpo1, Rpo2: digital potentiometer
TH1: thermistor
Q: power transistor
VCC: supply voltage

DESCRIPTION OF EMBODIMENTS

The exemplary embodiments of the present invention are described with the drawings.

[Outline of Embodiments]

In the temperature control circuit of the oven controlled crystal oscillator, a first digital potentiometer and a second digital potentiometer are correspondingly arranged in a bridge circuit which outputs a voltage to an input terminal of a differential amplifier, wherein the resistance value of the first digital potentiometer is variable so as to adjust the temperature of the oven to the peak temperature of the crystal resonator of OCXO, and the resistance value of the second digital potentiometer is variable so as to cancel the temperature gradient of the first digital potentiometer. The heat generation of the heater resistor is controlled by the power transistor based on the control voltage of the differential amplifier, and a temperature of the oven can be adjusted to the peak temperature of the crystal resonator of OCXO and the temperature gradient of the digital potentiometer can be cancelled. In addition, the oven controlled crystal oscillators of the following exemplary embodiments of the present invention utilize the aforementioned temperature control circuit.

Figure 1:
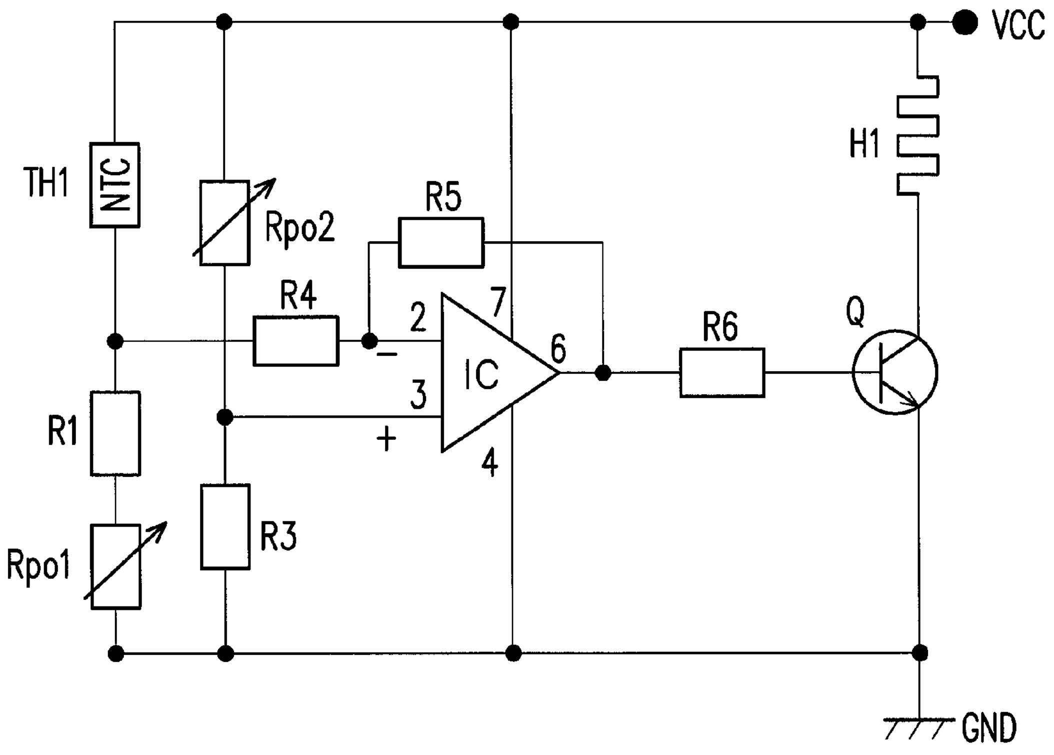
FIG. 1 schematically illustrates a diagram of a temperature control circuit of an oven controlled crystal oscillator according to a first exemplary embodiment of the present invention.

[Temperature Control Circuit of OCXO: FIG. 1]

The first embodiment of the temperature control circuit of OCXO is illustrated with FIG. 1. FIG. 1 schematically illustrates a circuit diagram of a temperature control of an oven controlled crystal oscillator according to a first exemplary embodiment of the present invention.

Referring to FIG. 1, the temperature control circuit (first control circuit) of OCXO of the first exemplary embodiment basically includes a thermistor TH1, a differential amplifier (OPAMP) IC, power transistor Q and heater H1.

[Connection Relationship of First Control Circuit]

An end of the heater resistor H1 is connected to a supply voltage VCC. The other end of the heater H1 is connected to a collector of the power transistor Q. Further, an emitter of the power transistor Q is connected to the ground GND.

In addition, an end of the thermistor TH1 is connected to and supplied by the supply voltage VCC. The other end of the thermistor TH1 is connected to an end of the resistor R1. The other end of the resistor R1 is connected to an end of the digital potentiometer Rpo1, and the other end of the digital potentiometer Rpo1 is connected to the ground GND.

Moreover, an end of the digital potentiometer Rpo2 is connected to and supplied by the supply voltage VCC, and the other end of the digital potentiometer Rpo2 is connected to an end of the resistor R3. The other end of the resistor R3 is connected to the ground GND. Herein, the resistor R3 is "the second resistor" recited in the claims. In addition, the differential amplifier IC is applied by the supply voltage VCC and connected to the ground GND.

And then, a point between the other end of the thermistor TH1 and an end of the resistor R1 is connected to a first input terminal (negative terminal) of the differential amplifier IC via a resistor R4, and a point between the other end of the digital potentiometer Rpo2 and an end of the resistor R3 is connected to a second input terminal (positive terminal) of the differential amplifier IC. In addition, the first input terminal (negative terminal) of the differential amplifier IC is connected to an output terminal of the differential amplifier IC via a resistor R5 for a feedback. Herein the resistor R5 is "the third resistor" recited in claims. Then, the output terminal of the differential amplifier IC is connected to a base of the power transistor Q via a resistor R6.

[Each Part of First Control Circuit]

[Thermistor TH1]

The thermistor TH1 is a temperature sensor of which the resistance value varies with temperature and detects the operational temperature of the crystal resonator.

[Differential Amplifier IC]

In the differential amplifier IC, the voltage between the thermistor TH1 and the resistor R1 is input to the first input terminal (negative terminal) via the resistor R4 with the output terminal of the differential amplifier IC inputting a feedback via the resistor R5, and the voltage between the digital potentiometer Rpo2 and the resistor R3 is input to the second input terminal (positive terminal), and the difference voltage between the two input terminals (negative terminal and positive terminal) is amplified.

[Power Transistor Q]

In the power transistor Q, the output of the differential amplifier IC is input to the base via the resistor R6, and a current flows between the collector and the emitter corresponding to the applied voltage of the base so that a current also flows through the heater resistor H1.

[Heater Resistor H1]

The heater resistor H1 generates heat corresponding to the current flowed. Herein the power transistor Q and the heater resistor H1 become the heat sources.

[Digital Potentiometer Rpo1, Rpo2]

The digital potentiometers Rpo1 and Rpo2, for example, are inter-integrated circuits ($I^2C$), serial peripheral interface (SPI), or the like. The digital potentiometers Rpo1 and Rpo2 are used to communicate with the outside and the resistance values thereof are variable by digital adjustment. Accordingly, soldering of the adjusting components is no longer needed. In addition, long-term stable, non-volatile materials are used in the digital potentiometer Rpo1 and Rpo2. Thus, the resistance value of the digital potentiometer, for example, may have a temperature gradient range of +100 to 800 ppm/° C.

Then, the resolution for setting optimal resistance values of the digital potentiometer is high, for example, if 8 bit (254 divisions) and resistance value of 10 kΩ is considered, a variable interval of 3.9Ω can be obtained. In conventional chip resistors, the variable interval is larger such as several hundreds Ω in 24 sequence, dozens of Ω in 96 sequence. However, in the circuit of the embodiment, since the resolution for setting resistance values is high, the temperature of the oven may not shift from the peak temperature of the crystal resonator and the frequency temperature characteristic can be enhanced.

[Function of Digital Potentiometer Rpo1]

The function of the digital potentiometer Rpo1 is described. The digital potentiometer Rpo1 is disposed for adjusting the oven temperature to the peak temperature of the crystal resonator after OCXO is assembled, and the resistance value thereof is adjusted to be variable and the optimal resistance value is set.

[Function of Digital Potentiometer Rpo2]

And then, the function of the digital potentiometer Rpo2 is described. The digital potentiometer Rpo2 is disposed to adjust the resistance value thereof for canceling the temperature gradient, since temperature gradient of resistance value is usually existed in digital potentiometer.

Namely, the digital potentiometer Rpo2 is disposed to match with the bridge circuit (the circuit including thermistor TH1, resistor R1, digital potentiometer Rpo1, digital potentiometer Rpo2 and resistor R3) so as to cancel the temperature gradient of the potentiometer Rpo1.

[Effect of Digital Potentiometer Rpo1, Rpo2]

If the resistance value (R1+Rpo1) of the resistor R1 and the digital potentiometer Rpo1 is set to be equal to the resistance value (Rpo2) of the digital potentiometer Rpo2, then the temperature gradient of the digital potentiometers can be cancelled. Accordingly, the resistance value (Rpo2) of the digital potentiometer Rpo2 is set to be greater than the resistance value (Rpo1) of the digital potentiometer (Rpo1) (resistance value (Rpo2)>resistance value (Rpo1)).

In addition, since the temperature gradient of the digital potentiometer is linear, the variation of temperature characteristic can be easily handled and the digital potentiometer is suitable for compensation circuit. In addition, both positive direction and negative direction can be compensated by adjusting both of the digital potentiometer Rpo1 and the digital potentiometer Rpo2. Accordingly, OCXO having high stability can be realized whereas it cannot be in conventional OCXO.

Since the digital potentiometer is packaged when the hybrid IC is fabricated, the cleaning process after the resistor is soldered to the circuit, which is required in conventional circuit, is no longer needed. Thus, the manufacturing time can be reduced and the quality of products can also be improved.

Moreover, compared to the conventional circuit, since the digital potentiometer can be controlled by a personal computer (PC), the resistor switching elements are no longer needed, the peak temperature can be detected and the setting of resistance value can be automatically performed.

Furthermore, since long-term reliable, non-volatile materials are utilized in digital potentiometers, mechanical impact problems and deterioration of contacting points due to long-term usage of the analog potentiometer can be avoided.

Figure 2:
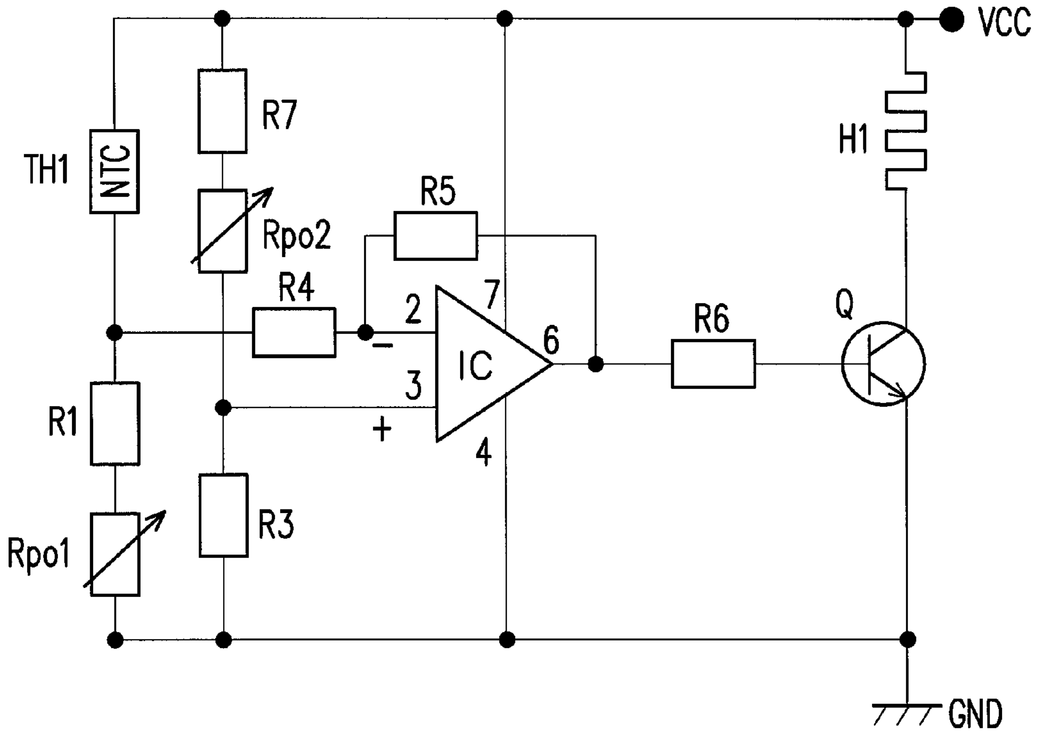
FIG. 2 schematically illustrates a diagram of a temperature control circuit of an oven controlled crystal oscillator according to a second exemplary embodiment of the present invention.

[Second Control Circuit: FIG. 2]

Then, the temperature control circuit of OCXO of the second exemplary embodiment of the present invention is illustrated. FIG. 2 schematically illustrates a diagram of a temperature control circuit of an oven controlled crystal oscillator according to a second exemplary embodiment of the present invention. Referring to FIG. 2, in the temperature control circuit, an end of the digital potentiometer Rpo2 which is applied by the supply voltage VCC is connected to the resistor R7 in series, and the other portions are the same of similar to that of first embodiment.

By providing the resistor R7 in series connection with the digital potentiometer Rpo2, the sensitivity of the digital potentiometer Rpo2 can be reduced, and thus the effect of easily adjusting the resistance value can be achieved.

Figure 3:
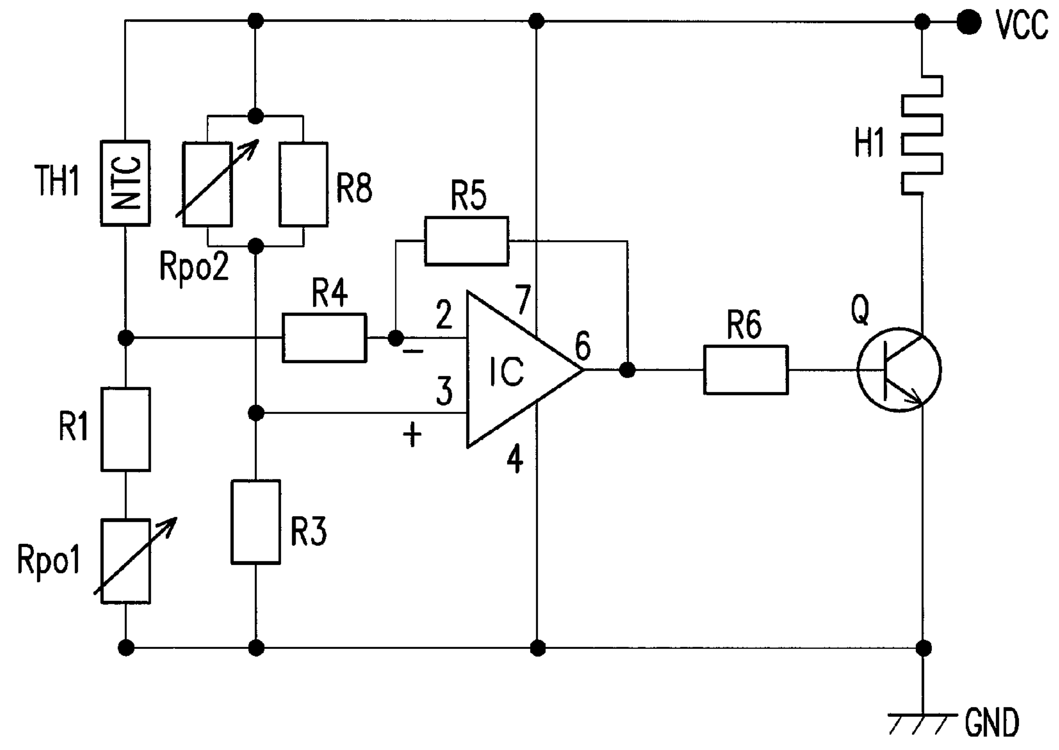
FIG. 3 schematically illustrates a diagram of a temperature control circuit of an oven controlled crystal oscillator according to a third exemplary embodiment of the present invention.
Figure 4:
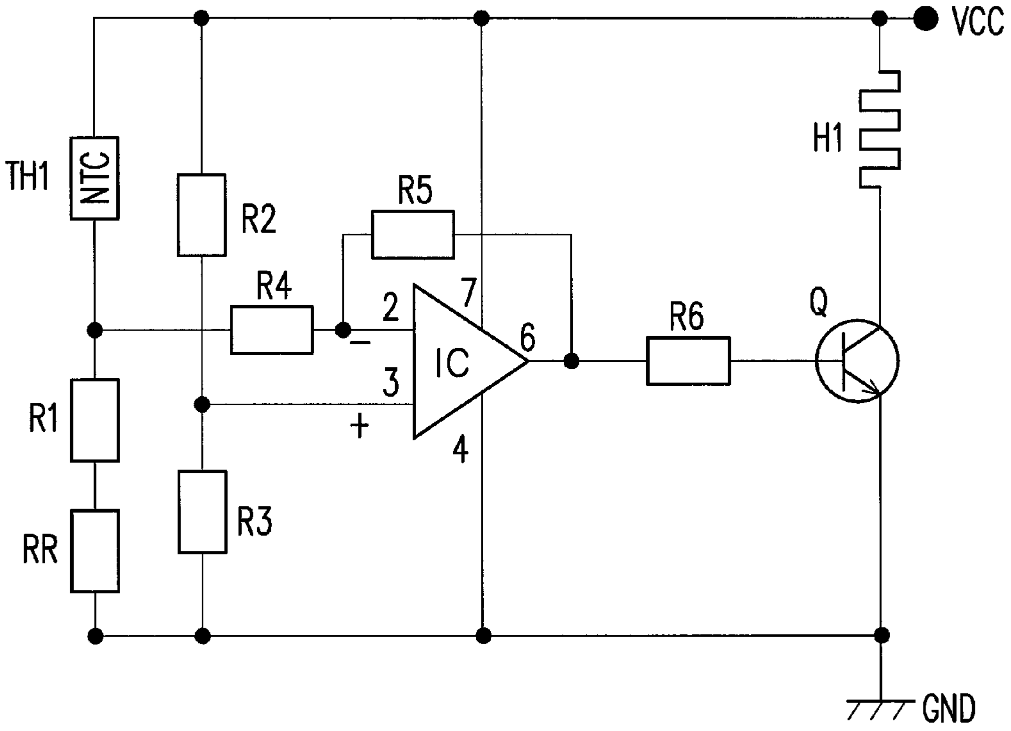
FIG. 4 (RELATED ART)
FIG. 4 schematically illustrates a diagram of a temperature control circuit of a conventional oven controlled crystal oscillator of related art.

[Third Control Circuit: FIG. 3]

Then, the temperature control circuit of OCXO of the third exemplary embodiment of the present invention is illustrated. FIG. 3 schematically illustrates a diagram of a temperature control circuit of an oven controlled crystal oscillator according to a third exemplary embodiment of the present invention. Referring to FIG. 3, in the temperature control circuit, a resistor R8 is connected to an end of the digital potentiometer Rpo2 in parallel, and the other portions are the same of similar to that of first embodiment.

By providing the resistor R8 in parallel connection with the digital potentiometer Rpo2, fine adjustment of the resistance value of the digital potentiometer Rpo2 can be achieved.

[Effect of Embodiments]

In light of the foregoing, in the temperature control circuit, the first digital potentiometer and the second digital potentiometer are correspondingly arranged in the bridge circuit which outputs a voltage to the first input terminal of the differential amplifier, wherein the resistance value of the first digital potentiometer is adjustable so as to adjust the temperature of the oven to the peak temperature of the crystal resonator of OCXO, and the resistance value of the second digital potentiometer is adjustable so as to cancel the temperature gradient of the first digital potentiometer. The heat generation of the heater resistor is controlled by the power transistor based on the control voltage of the differential amplifier. The temperature of the oven can be adjusted to the peak temperature of the crystal resonator of OCXO and the temperature gradient of the digital potentiometer can be cancelled.

In addition, obtaining an oscillator with a high stability can be realized by disposing the temperature control circuit mentioned above in OCXO.

The temperature control circuit of the present invention is suitable to be used in OCXO for adjusting the oven temperature to the peak temperature of the crystal resonator of OCXO and canceling the temperature gradient of the digital potentiometer.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A temperature control circuit in an oven controlled crystal oscillator, comprising:

a heater resistor for generating heat, wherein one end of the heater resister is connected to a supply voltage;

a thermistor, wherein one end of the thermistor is supplied with the supply voltage, and a resistance value of the thermistor varies with a temperature of the thermistor, and an other end of the thermistor outputs a voltage corresponding to the temperature;

a first resistor, wherein one end of the first resistor is connected to the other end of the thermistor;

a first digital potentiometer, wherein one end of the first digital potentiometer is connected to an other end of the first resistor and an other end of the first digital potentiometer is connected to a ground, and a resistance value of the first digital potentiometer is adjustable in a digital controlled manner;

a second digital potentiometer, wherein one end of the second digital potentiometer is supplied with the supply voltage, wherein a resistance value of the second digital potentiometer is adjustable in the digital controlled manner;

a second resistor, wherein one end of the second resistor is connected to an other end of the second digital potentiometer and an other end of the second resistor is connected to the ground;

a differential amplifier, having a first input terminal, a second input terminal and an output terminal, wherein a voltage between the other end of the thermistor and the one end of the first resistor is input to the first input terminal, a voltage between the other end of the second digital potentiometer and the one end of the second resistor is input to the second input terminal, the output terminal is connected to the first input terminal via a third resistor to provide a feedback, a difference between the voltage input to the first input terminal and the voltage input to the second input terminal is amplified and output as a control voltage; and a power transistor, having a collector connected to an other end of the heater resistor, a base inputting the control voltage output from the differential amplifier and an emitter connected to the ground, wherein the power transistor controls the heat generated by the heater resistor based on the control voltage from the differential amplifier.

2. The temperature control circuit according to claim 1, wherein the resistance value of the first digital potentiometer is adjustable so as to adjust a temperature of the oven to a peak temperature of a crystal resonator in the oven controlled crystal oscillator, the resistance value of the second digital potentiometer is adjustable so as to cancel a temperature gradient of the first digital potentiometer.

3. The temperature control circuit according to claim 1, wherein the resistance value of the second digital potentiometer is greater than the resistance value of the first digital potentiometer.

4. The temperature control circuit according to claim 2, wherein the resistance value of the second digital potentiometer is greater than the resistance value of the first digital potentiometer.

5. The temperature control circuit according to claim 1, wherein a fourth resistor is arranged between the supply voltage and the one end of the second digital potentiometer in series.

6. The temperature control circuit according to claim 2, wherein a fourth resistor is arranged between the supply voltage and the one end of the second digital potentiometer in series.

7. The temperature control circuit according to claim 3, wherein a fourth resistor is arranged between the supply voltage and the one end of the second digital potentiometer in series.

8. The temperature control circuit according to claim 4, wherein a fourth resistor is arranged between the supply voltage and the one end of the second digital potentiometer in series.

9. The temperature control circuit according to claim 1, wherein a fifth resistor is arranged in parallel with the second digital potentiometer.

10. The temperature control circuit according to claim 2, wherein a fifth resistor is arranged in parallel with the second digital potentiometer.

11. The temperature control circuit according to claim 3, wherein a fifth resistor is arranged in parallel with the second digital potentiometer.

12. The temperature control circuit according to claim 4, wherein a fifth resistor is arranged in parallel with the second digital potentiometer.

13. The temperature control circuit according to claim 1, wherein the voltage between the other end of the thermistor and the one end of the first resistor is input to the first input terminal of the differential amplifier via a sixth resistor, the output from the output terminal of the differential amplifier is input to the base of the power transistor via a seventh resistor.

14. The temperature control circuit according to claim 2, wherein the voltage between the other end of the thermistor and the one end of the first resistor is input to the first input terminal of the differential amplifier via a sixth resistor, the output from the output terminal of the differential amplifier is input to the base of the power transistor via a seventh resistor.

15. The temperature control circuit according to claim 3, wherein the voltage between the other end of the thermistor and the one end of the first resistor is input to the first input terminal of the differential amplifier via a sixth resistor, the output from the output terminal of the differential amplifier is input to the base of the power transistor via a seventh resistor.

16. The temperature control circuit according to claim 4, wherein the voltage between the other end of the thermistor and the one end of the first resistor is input to the first input terminal of the differential amplifier via a sixth resistor, the output from the output terminal of the differential amplifier is input to the base of the power transistor via a seventh resistor.

17. An oven controlled crystal oscillator including a temperature control circuit, wherein the temperature control circuit comprising:

a heater resistor for generating heat, wherein one end of the heater resister is connected to a supply voltage;

a thermistor, wherein one end of the thermistor is supplied with the supply voltage, and a resistance value of the thermistor varies with a temperature of the thermistor, and an other end of the thermistor outputs a voltage corresponding to the temperature;

a first resistor, wherein one end of the first resistor is connected to the other end of the thermistor;

a first digital potentiometer, wherein one end of the first digital potentiometer is connected to an other end of the first resistor and an other end of the first digital potentiometer is connected to a ground, and a resistance value of the first digital potentiometer is adjustable in a digital controlled manner;

a second digital potentiometer, wherein one end of the second digital potentiometer is supplied with the supply voltage, wherein a resistance value of the second digital potentiometer is adjustable in the digital controlled manner;

a second resistor, wherein one end of the second resistor is connected to an other end of the second digital potentiometer and an other end of the second resistor is connected to the ground;

a differential amplifier, having a first input terminal, a second input terminal and an output terminal, wherein a voltage between the other end of the thermistor and the one end of the first resistor is input to the first input terminal, a voltage between the other end of the second digital potentiometer and the one end of the second resistor is input to the second input terminal, the output terminal is connected to the first input terminal via a third resistor to provide a feedback, a difference between the voltage input to the first input terminal and the voltage input to the second input terminal is amplified and output as a control voltage; and a power transistor, having a collector connected to an other end of the heater resistor, a base inputting the control voltage output from the differential amplifier and an emitter connected to the ground, wherein the power transistor controls the heat generated by the heater resistor based on the control voltage from the differential amplifier.

18. The oven controlled crystal oscillator according to claim 17, wherein the resistance value of the first digital potentiometer is adjustable so as to adjust a temperature of the oven to a peak temperature of a crystal resonator in the oven controlled crystal oscillator, the resistance value of the second digital potentiometer is adjustable so as to cancel a temperature gradient of the first digital potentiometer.

19. The oven controlled crystal oscillator according to claim 17, wherein the resistance value of the second digital potentiometer is greater than the resistance value of the first digital potentiometer.

20. The oven controlled crystal oscillator according to claim 18, wherein the resistance value of the second digital potentiometer is greater than the resistance value of the first digital potentiometer.

* * * * *